US012765363B2

(12) United States Patent
Kim et al.

(10) Patent No.: US 12,765,363 B2
(45) Date of Patent: Oct. 13, 2026

(54) INTEGRATED CIRCUIT DEVICE

(71) Applicant: SAMSUNG ELECTRONICS CO., LTD., Suwon-si (KR)

(72) Inventors: Yongjin Kim, Suwon-si (KR); Sanghoon Ahn, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 422 days.

(21) Appl. No.: 18/219,244

(22) Filed: Jul. 7, 2023

(65) Prior Publication Data

US 2024/0096796 A1 Mar. 21, 2024

(30) Foreign Application Priority Data

Sep. 20, 2022 (KR) ........................ 10-2022-0118713

(51) Int. Cl.

| | |
|---|---|
| ***H10W 20/41*** | (2026.01) |
| ***H10P 50/28*** | (2026.01) |
| ***H10W 20/00*** | (2026.01) |
| ***H10W 20/42*** | (2026.01) |
| ***H10W 20/47*** | (2026.01) |

(52) U.S. Cl.

CPC ....... *H10W 20/435* (2026.01); *H10W 20/035* (2026.01); *H10W 20/075* (2026.01); *H10W 20/076* (2026.01); *H10W 20/089* (2026.01); *H10W 20/42* (2026.01); *H10W 20/425* (2026.01); *H10W 20/47* (2026.01); *H10P 50/282* (2026.01)

(58) Field of Classification Search

CPC ....... H01L 21/76849; H01L 21/76885; H10W 20/435

See application file for complete search history.

(56) References Cited

U.S. PATENT DOCUMENTS

| | | | | |
|---|---|---|---|---|
| 6,838,355 | B1 * | 1/2005 | Stamper ............ H01L 21/76849 438/428 | |
| 9,324,650 | B2 | 4/2016 | Edelstein et al. | |
| 9,659,864 | B2 | 5/2017 | Wu et al. | |
| 10,403,542 | B2 | 9/2019 | Roy et al. | |

(Continued)

FOREIGN PATENT DOCUMENTS

| | | | |
|---|---|---|---|
| JP | 2006-216964 | A | 8/2006 |
| KR | 10-2019-0067455 | A | 6/2019 |
| KR | 10-2020-0027817 | A | 3/2020 |

*Primary Examiner* — Erik Kielin

(74) *Attorney, Agent, or Firm* — Muir Patent Law, PLLC

(57) ABSTRACT

An integrated circuit device includes a plurality of wiring structures on a substrate and extending in a first direction parallel to an upper surface of the substrate and each including a wiring layer on the substrate and extending in a direction perpendicular to the upper surface of the substrate; an insulating pattern surrounding a sidewall of the wiring layer and including a first insulating material; and a capping layer on an upper surface of the wiring layer and including a conductive material; a via layer on the wiring structures, the via layer being electrically connected to one wiring structure; and an interlayer insulating layer covering a sidewall of the insulating pattern between each wiring structure of the plurality of wiring structures, the interlayer insulating layer having an upper surface higher than an upper surface of each wiring layer and an upper surface of each insulating pattern.

20 Claims, 16 Drawing Sheets

(56) References Cited

U.S. PATENT DOCUMENTS

| | | | | |
|---|---|---|---|---|
| 11,302,573 | B2 | 4/2022 | De Silva et al. | |
| 2015/0056800 | A1 | 2/2015 | Mebarki et al. | |
| 2019/0181088 | A1* | 6/2019 | Lee | H01L 21/76832 |
| 2020/0075596 | A1* | 3/2020 | Shin | H10D 30/62 |
| 2020/0303253 | A1 | 9/2020 | Aizawa et al. | |
| 2021/0090952 | A1 | 3/2021 | Freed et al. | |
| 2021/0249305 | A1 | 8/2021 | Tapily et al. | |
| 2021/0265348 | A1* | 8/2021 | Xie | H10D 64/015 |
| 2022/0285514 | A1* | 9/2022 | Chen | H10D 30/014 |
| 2022/0320088 | A1* | 10/2022 | Pan | H10D 64/017 |

* cited by examiner

INTEGRATED CIRCUIT DEVICE

CROSS-REFERENCE TO RELATED APPLICATION

This application is based on and claims priority under 35 U.S.C. § 119 to Korean Patent Application No. 10-2022-0118713, filed on Sep. 20, 2022, in the Korean Intellectual Property Office, the disclosure of which is incorporated by reference herein in its entirety.

BACKGROUND

1. Field

Embodiments relate to an integrated circuit device.

2. Description of the Related Art

An increase in the speed of complementary metal oxide semiconductors (CMOSs) and logic devices may be dependent on reducing a gate delay time by reducing the length of a gate. As the high integration of semiconductor devices progresses, device speed may be determined by a resistance capacitance (RC) delay due to metal wirings of a back end of line (BEOL).

SUMMARY

The embodiments may be realized by providing an integrated circuit device including a substrate; a plurality of wiring structures on the substrate, the plurality of wiring structures extending in a first direction parallel to an upper surface of the substrate and each including a wiring layer on the substrate and extending in a direction perpendicular to the upper surface of the substrate; an insulating pattern surrounding a sidewall of the wiring layer and including a first insulating material; and a capping layer on an upper surface of the wiring layer and including a conductive material; a via layer on the plurality of wiring structures, the via layer being electrically connected to one wiring structure of the plurality of wiring structures; and an interlayer insulating layer covering a sidewall of the insulating pattern between each wiring structure of the plurality of wiring structures, the interlayer insulating layer having an upper surface higher than an upper surface of each wiring layer and an upper surface of each insulating pattern.

The embodiments may be realized by providing an integrated circuit device including a substrate; a first wiring structure on the substrate, the first wiring structure extending in a first direction parallel to an upper surface of the substrate; a second wiring structure spaced apart from the first wiring structure in a second direction perpendicular to the first direction; a via layer on the first wiring structure and connected to the first wiring structure; and an interlayer insulating layer between the first wiring structure and the second wiring structure, wherein the first wiring structure includes a first wiring layer on the substrate and extending in a direction perpendicular to the upper surface of the substrate, and an insulating pattern surrounding a sidewall of the first wiring layer and including a first insulating material, and the interlayer insulating layer covers a sidewall of the insulating pattern between the first wiring structure and the second wiring structure and has an upper surface higher than an upper surface of each of the first wiring layer and the insulating pattern.

The embodiments may be realized by providing an integrated circuit device including a substrate; a plurality of wiring structures on the substrate, the plurality of wiring structures extending in a first direction parallel to an upper surface of the substrate and each including a wiring layer on the substrate and extending in a direction perpendicular to the upper surface of the substrate, an insulating pattern surrounding a sidewall of the wiring layer and including a first insulating material, and a capping layer on an upper surface of the wiring layer and including a conductive material, a via layer on the plurality of wiring structures, the via layer being connected to one wiring structure of the plurality of wiring structures; and an interlayer insulating layer covering a sidewall of the insulating pattern between each wiring structure of the plurality of wiring structures, the interlayer insulating layer having an upper surface higher than an upper surface of each wiring layer and higher than an upper surface of insulating pattern, wherein the capping layer has a height in a direction perpendicular to the upper surface of the substrate that is less than a height of the wiring layer and is less than a height of the via layer, the upper surface of each insulating pattern is at a vertical level lower than an upper surface of each capping layer, each insulating pattern has a constant thickness along the sidewall of each wiring layer, the via layer includes a first portion having a width in a second direction perpendicular to the first direction that is less than a width of the one wiring structure, and a second portion on the first portion, the second portion having a width in the second direction that is greater than the width of the one wiring structure in the second direction, the first insulating material includes $SiO_2$, $Al_2O_3$, or a combination thereof, and the conductive material includes graphene, Ti, Al, Cr, Au, Ni, Pt, or a combination thereof.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
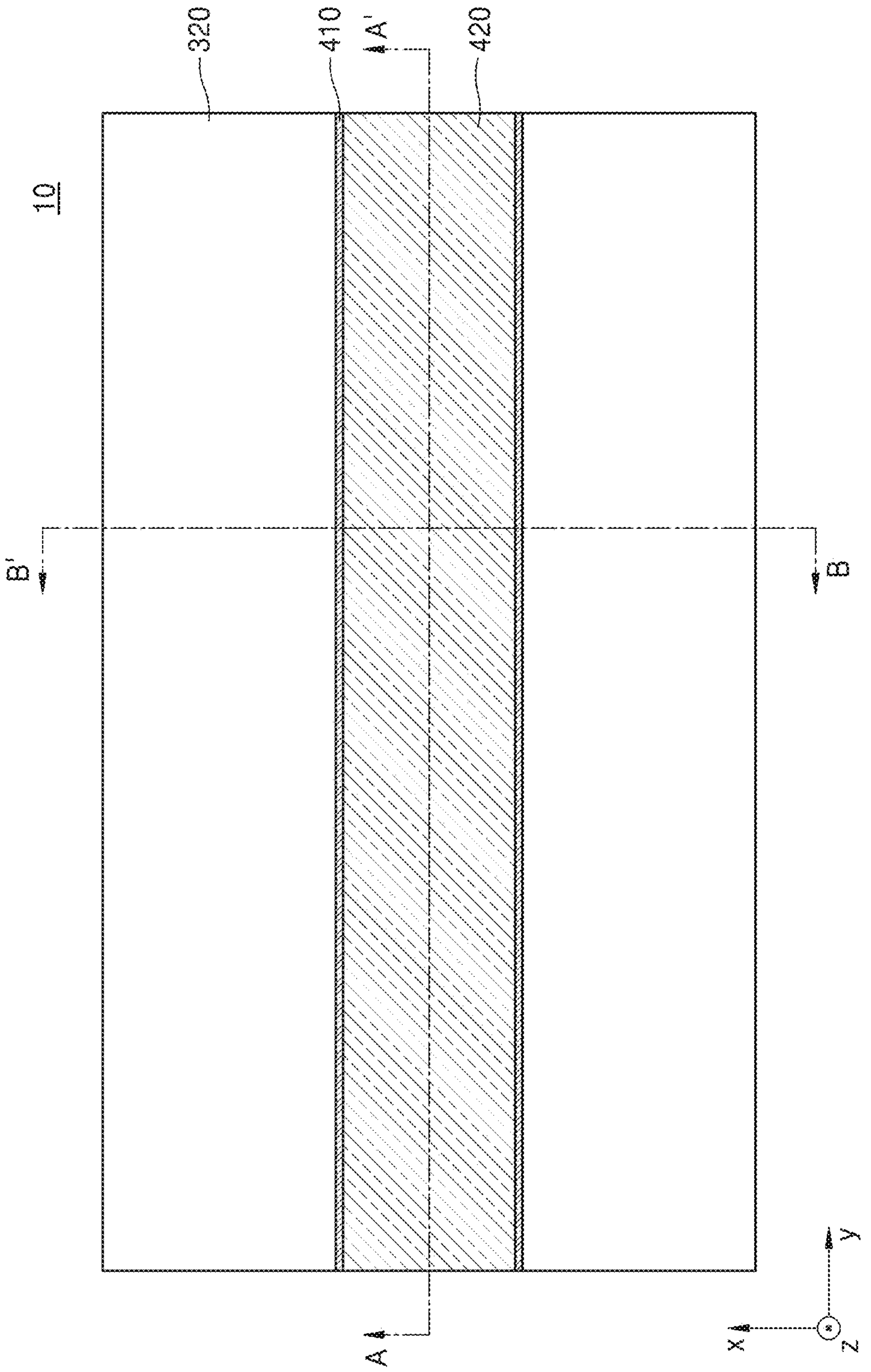
FIG. 1 is a top view illustrating an integrated circuit device according to an embodiment.
Figure 2:
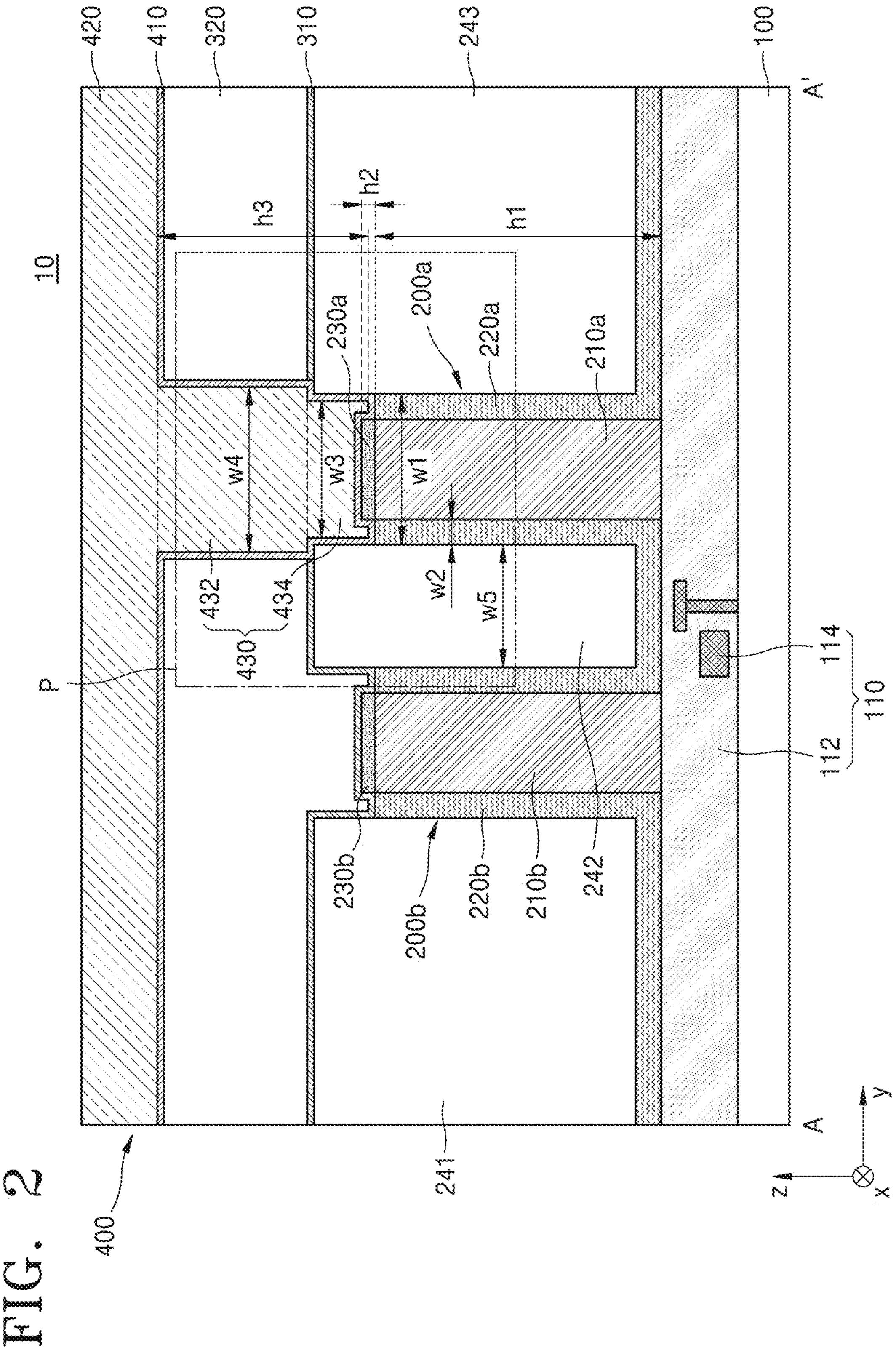
FIG. 2 is a cross-sectional view of the integrated circuit device shown in FIG. 1 along a line A-A'.
Figure 3:
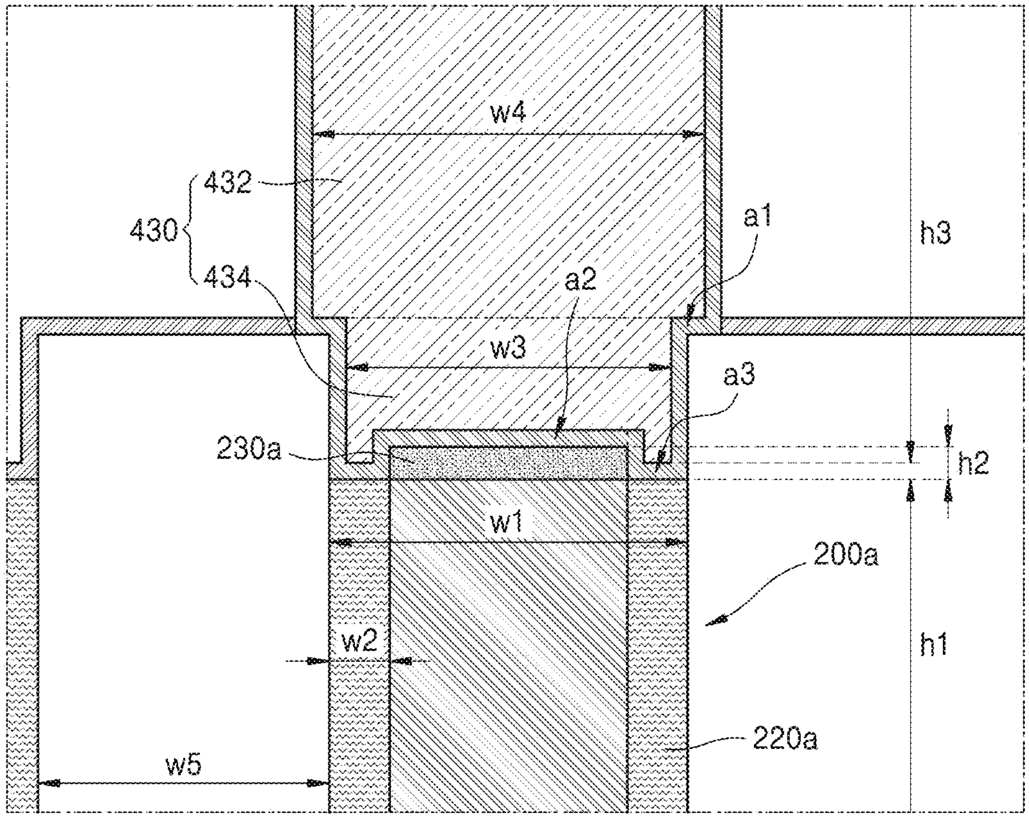
FIG. 3 is an enlarged cross-sectional view of a part P shown in FIG. 2.
Figure 4:
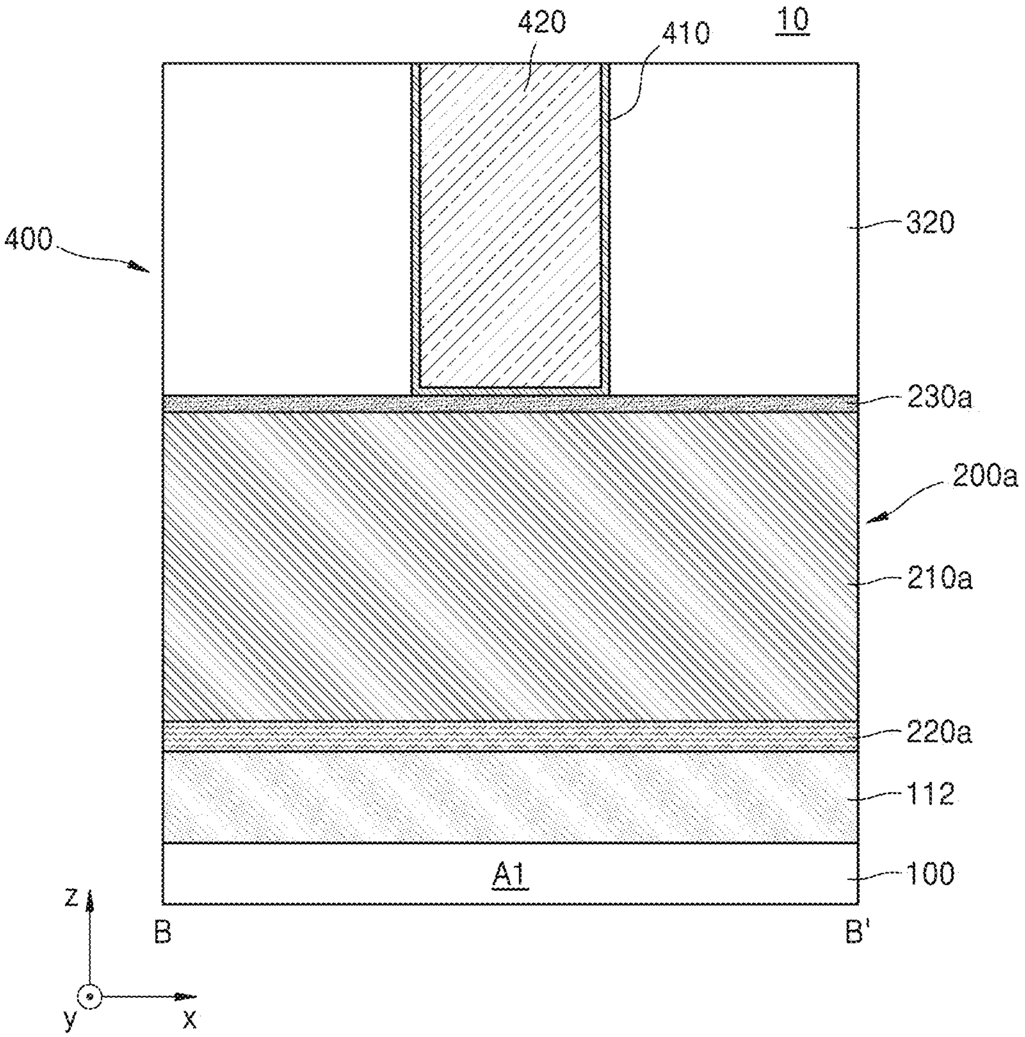
FIG. 4 is a cross-sectional view of the integrated circuit device shown in FIG. 1 along a line B-B'.

FIG. 1 is a top view illustrating an integrated circuit device 10 according to an embodiment, and FIG. 2 is a cross-sectional view of the integrated circuit device 10 shown in FIG. 1 along a line A-A'. In addition, FIG. 3 is an enlarged cross-sectional view of a part P shown in FIG. 2, and FIG. 4 is a cross-sectional view of the integrated circuit device 10 shown in FIG. 1 along a line B-B'.

Referring to FIGS. 1 to 4, a first direction (x direction) and a second direction (y direction) may cross each other among horizontal directions. In an implementation, the first direction (x direction) and the second direction (y direction) may perpendicularly cross each other. A third (e.g., vertical) direction (z direction) may cross both the first direction (x direction) and the second direction (y direction). In an implementation, the third direction (z direction) may be perpendicularly orthogonal to the first direction (x direction) and the second direction (y direction). In an implementation, the first direction (x direction), the second direction (y direction), and the third direction (z direction) may be orthogonal to each other.

In an implementation, the integrated circuit device 10 may include a substrate 100, and a plurality of wiring structures 200*a* and 200*b* extending (e.g., lengthwise) in the first direction (x direction) parallel to the upper surface of the substrate 100 on the substrate 100, and a via layer 430 on or over the plurality of wiring structures 200*a* and 200*b* and connected to a corresponding (e.g., connected to one) first wiring structure 200*a* of the plurality of wiring structures.

The integrated circuit device 10 may include a front-end-of-line (FEOL) structure 110 between the substrate 100 and the plurality of wiring structures 200*a* and 200*b*. The FEOL structure 110 may include a plurality of individual devices 114 of various types and a lower insulating layer 112. The plurality of individual devices 114 may include various microelectronic devices, e.g., image sensors such as metal-oxide-semiconductor field effect transistors (MOSFETs), large scale integrations (LSIs), CMOS imaging sensors (CIS), or the like, micro-electro-mechanical systems (MEMSs), active devices, passive devices, or the like. The plurality of individual devices 114 may be electrically connected to a conductive region of the substrate 100. In an implementation, each of the plurality of individual devices 114 may be electrically separated (e.g., isolated) from other neighboring individual devices 114 by the lower insulating layer 112.

In an implementation, the lower insulating layer 112 may be made of or include, e.g., a silicon oxide material. In an implementation, the lower insulating layer 112 may include, e.g., plasma enhanced oxide (PEOX), tetraethyl orthosilicate (TEOS), boro TEOS (BTEOS), phosphorous TEOS (PTEOS), boro phospho TESO (BPTEOS), boro silicate glass (BSG), phospho silicate glass (PSG), boro phospho silicate glass (BPSG), or the like. In an implementation, the lower insulating layer 112 may include, e.g., a low dielectric layer having a low dielectric constant k of about 2.2 to about 3.0, e.g., a SiOC layer or a SiCOH layer. As used herein, the term "or" is not an exclusive term, e.g., "A or B" would include A, B, or A and B.

In an implementation, the first wiring structure 200*a* may include a first wiring layer 210*a* extending in the vertical direction (z direction) perpendicular to the upper surface of the substrate 100 on the substrate 100. The first wiring layer 210*a* may be a wiring formed in a back end of line (BEOL) process. The first wiring layer 210*a* may include, e.g., aluminum (Al), an aluminum alloy (Al-alloy), tungsten (W), cobalt (Co), copper (Cu), ruthenium (Ru), gold (Au), silver (Ag), or a combination thereof. In an implementation, the first wiring layer 210*a* may include W.

In an implementation, the first wiring structure 200*a* may include a first insulating pattern 220*a* surrounding a sidewall of the first wiring layer 210*a* and including a first insulating material. The first insulating material may include, e.g., $SiO_2$, SiCOH, SiF, SiOC, $Al_2O_3$, or a combination thereof. In an implementation, the first insulating pattern 220*a* may be formed by an atomic layer deposition (ALD) or chemical vapor deposition (CVD) process. When the first insulating pattern 220*a* is deposited by the ALD process, the first insulating pattern 220*a* may have a uniform thickness w2 (e.g., in the y direction). In an implementation, the first insulating pattern 220*a* may have a constant thickness along the sidewall of the first wiring layer 210*a*. The first insulating pattern 220*a* may be formed on the FEOL structure 110 as well as on the sidewall of the first wiring layer 210*a*. In an implementation, the first insulating pattern 220*a* may have the uniform thickness w2 in the second direction (y direction) on the FEOL structure 110. In an implementation, an upper surface of the first insulating pattern 220*a* (e.g., surface facing away from the substrate 100) may be at a lower vertical level than (e.g., closer to the substrate 100 in the z direction than) an upper surface of a first capping layer 230*a*, and may be at substantially the same vertical level as an upper surface of the first wiring layer 210*a*. In an implementation, the upper surface of the first insulating pattern 220*a* may be at substantially the same vertical level as the upper surface of the first capping layer 230*a* and at a higher vertical level than the upper surface of the first wiring layer 210*a*. Some embodiments are described below with reference to the other drawings.

In an implementation, the first insulating pattern 220*a* including the first insulating material may be deposited on the sidewall of the first wiring layer 210*a*, and the horizontal level of the first wiring structure 200*a* may be adjusted by adjusting the width w2 of the first insulating pattern 220*a*. This may also be the same as the case of a second insulating pattern 220*b* of a second wiring structure 200*b*.

In an implementation, the first wiring structure 200*a* may include the first capping layer 230*a* on the upper surface of the first wiring layer 210*a*. In an implementation, the first capping layer 230*a* may include a conductive material. The conductive material may include, e.g., graphene, Ti, Al, Cr, Au, Ni, Pt, or a combination thereof. In an implementation, the conductive material may include Ti. In an implementation, the first capping layer 230*a* may include the conductive material, and the first capping layer 230*a* may electrically connect the via layer 430 (on the first capping layer 230*a*) to the first wiring layer 210*a* (below the first capping layer 230*a*). In an implementation, the first capping layer 230*a* may include an insulating material. The insulating material may include, e.g., SiOC, SiCN, SiOCN, $Al_2O_3$, AlN, or a combination thereof. In an implementation, the first capping layer 230*a* may include SiCN. In an implementation, the first capping layer 230*a* may include the insulating material, and the first capping layer 230*a* may electrically insulate the via layer 430 on the first capping layer 230*a* from the first wiring layer 210*a* below the first capping layer 230*a*. In an implementation, in order to electrically connect the via layer 430 to the first wiring layer 210*a*, the first capping layer 230*a* may be removed. This will be in detail described below with reference to some embodiments.

When forming the first capping layer 230*a* on the upper surface of the first wiring layer 210*a* and including the conductive material, the vertical level of the first wiring structure 200*a* may be adjusted by adjusting an etching degree of the first capping layer 230*a*. This may also be the same as the case of a second capping layer 230*b* of the second wiring structure 200*b*.

In the vertical direction (z direction) perpendicular to the upper surface of the substrate 100, a height h2 of the first capping layer 230*a* may be less than a height h1 of the first wiring layer 210*a*, and may be less than a height h3 of the via layer 430. In an implementation, the height of the first wiring layer 210*a* in the second direction (y direction) may be less than the width of the via layer 430.

In an implementation, the integrated circuit device 10 may include first, second, and third interlayer insulating layers 241, 242, and 243 on the first insulating pattern 220*a* and the second insulating pattern 220*b*. As shown in FIG. 2, the first interlayer insulating layer 241 may be on the left side of the first wiring structure 200*a* in the second direction (y direction), and the third interlayer insulating layer 243 may be on the right side of the second wiring structure 200*b* in the second direction (y direction). The second interlayer insulating layer 242 may be between the first wiring structure 200*a* and the second wiring structure 200*b* in the second direction (y direction). In an implementation, the first, second, and third interlayer insulating layers 241, 242, and 243 may cover sidewalls of the first and second insulating patterns 220*a* and 220*b*, with the plurality of wiring structures 200*a* and 200*b* therebetween. In an implementation, the first, second, and third interlayer insulating layers 241, 242, and 243 may have upper surfaces higher than the respective upper surfaces of the first wiring layer 210*a* and the first insulating pattern 220*a*. The first, second, and third interlayer insulating layers 241, 242, and 243 may be formed on the FEOL structure 110 by an ALD process or a CVD process. In an implementation, the second interlayer insulating layer 242 between the first wiring structure 200*a* and the second wiring structure 200*b* may have a constant thickness or width w5.

In an implementation, each of the first, second, and third interlayer insulating layers 241, 242, and 243 may include a second insulating material. In an implementation, the second insulating material may include a low-k material having a permittivity equal to or less than 4.2. The low-k material may include, e.g., $SiO_2$, SiOCH, SiF, SiOC, or a combination thereof. In an implementation, the low-k material may include silicon oxide doped with fluorine such as SiOF, e.g., silicon oxide doped with carbon such as SiOCH, porous silicon oxide, inorganic polymer such as hydrogen silsesquioxane (HSSQ) or methyl silsesquioxane (MSSQ), or spin-on organic polymer. In an implementation, the interlayer insulating layers 241, 242, and 243 may include SiOCH. The second insulating material included in each of the first, second, and third interlayer insulating layers 241, 242, and 243 may include a material having an etch selectivity with respect to the first insulating material included in the first insulating pattern 220*a*. In an implementation, the second insulating material may include a material different from the first insulating material. In an implementation, in a process of forming the first insulating pattern 220*a* by etching the insulating layer, the first, second, and third interlayer insulating layers 241, 242, and 243 may be hardly etched or etched relatively slowly compared to the etching rate of the insulating layer.

In an implementation, a surface treatment process may be performed on the upper portions of the first, second, and third interlayer insulating layers 241, 242, and 243. In an implementation, the surface treatment process may include doping carbon on the upper portions of the first, second, and third interlayer insulating layers 241, 242, and 243. In an implementation, when the first, second, and third interlayer insulating layers 241, 242, and 243 include carbon, e.g., SiOCH, the carbon concentration of the upper portion may be higher than those of other portions, and a high-concentration carbon region may be formed. In an implementation, when the first, second, and third interlayer insulating layers 241, 242, and 243 do not include carbon, e.g., when the first, second, and third interlayer insulating layers 241, 242, and 243 include, e.g., SiOF, a carbon-containing layer may be formed on the first, second, and third interlayer insulating layers 241, 242, and 243. In an implementation, the high-concentration carbon region or the carbon-containing layer may have hydrophobicity that does not combine well with water.

An upper wiring structure 400 may include an upper wiring layer 420 and the via layer 430. The upper wiring layer 420 may have a thickness in the second direction (y direction). The via layer 430 may be integrally formed with the upper wiring layer 420 and connected to the first wiring structure 200*a*. The via layer 430 may include a first via layer portion 434 on the first wiring structure 200*a* and a second via layer portion 432 formed integrally with the first via layer portion 434 on the first via layer portion 434. A width w3 of the first via layer portion 434 (e.g., in the y direction) may be less than a width w1 (e.g., in the y direction) of the first wiring structure 200*a*. A width w4 (e.g., in the y direction) of the second via layer portion 432 may be greater than the width w1 of the first wiring structure 200*a* and the width w3 of the first via layer portion 434.

The upper wiring layer 420 may be in a trench formed in a line shape extending in the second direction (y direction), and the via layer 430 may be integrally formed with the upper wiring layer 420 in a recess in the trench in a direction extending toward the substrate 100. In an implementation, the upper wiring layer 420 and the via layer 430 may be formed in a dual damascene wiring structure. The upper wiring layer 420 and the via layer 430 may include, e.g., aluminum (Al), an aluminum alloy (Al-alloy), copper (Cu), gold (Au), silver (Ag), tungsten (W), molybdenum (Mo), or a combination thereof. In an implementation, the upper wiring layer 420 and the via layer 430 may include copper (Cu). In an implementation, the upper wiring layer 420 and the via layer 430 may be formed by, e.g., reflow after sputtering, a CVD method, or an electroplating method. In the electroplating method, a seed layer may be formed in order to flow current during electrolysis.

In an implementation, the integrated circuit device 10 may include an upper insulating layer 320 between the upper wiring structure 400 and (e.g., portions of) the plurality of wiring structures 200*a* and 200*b*. The upper insulating layer 320 may include an insulating material. In an implementation, the insulating material may include a low-k material having a permittivity equal to or less than 4.2. The low-k material may include, e.g., $SiO_2$, SiOCH, SiF, SiOC, or a combination thereof. In an implementation, the low-k material may include silicon oxide doped with fluorine such as SiOF, e.g., silicon oxide doped with carbon such as SiOCH, porous silicon oxide, inorganic polymer such as HSSQ or MSSQ, or a spin-on organic polymer. In an implementation, the upper insulating layer 320 may include SiOCH. The insulating material included in the upper insulating layer 320 may be substantially the same material as the second insulating material included in each of the first, second, and third interlayer insulating layers 241, 242, and 243.

The integrated circuit device 10 may include an etch stop layer 310 between the upper insulating layer 320 and the first, second, and third interlayer insulating layers 241, 242, and 243. The etch stop layer 310 may include a material having an etch selectivity with respect to the insulating material included in each of the first, second, and third interlayer insulating layers 241, 242, and 243.

In an implementation, the integrated circuit device 10 may include a barrier layer 410 covering side and lower surfaces of the via layer 430. In an implementation, the barrier layer 410 may cover the lower surface of the upper wiring layer 420. The barrier layer 410 may contact (e.g., directly contact) the upper and side surfaces of the first capping layer 230*a*. In an implementation, the first capping layer 230*a* and the via layer 430 may be spaced apart from each other with the barrier layer 410 therebetween. The barrier layer 410 may have a constant thickness along the lower surface of the upper wiring layer 420 and the side and lower surfaces of the via layer 430. The barrier layer 410 may include, e.g., ruthenium (Ru), cobalt (Co), tantalum (Ta), tantalum nitride (TaN), titanium (Ti), titanium nitride (TiN), tungsten (W), tungsten nitride (WN), ruthenium (Ru), or a combination thereof (e.g., an alloy or a stack structure). In an implementation, the barrier layer 410 may help prevent a component (e.g., copper) of the via layer 430 from diffusing into adjacent layers.

As shown in FIG. 3, the barrier layer 410 may include a first portion a1 covering at least part of the upper surfaces of the second interlayer insulating layer 242 and the third interlayer insulating layer 243, a second portion a2 covering the upper surface of the first capping layer 230*a* and at a vertical level lower than the upper surfaces of the first, second, and third interlayer insulating layers 241, 242, and 243, and a third portion a3 covering the sidewall of the first capping layer 230*a* and protruding toward the substrate 100. The first portion a1 may include a part extending with a certain length in the second direction (y direction) and a part extending with a certain length in the third direction (z direction). In an implementation, a proportion of the part extending with the certain length in the third direction (z direction) may be greater than a proportion of the part extending with the certain length in the second direction (y direction). The second portion a2 may include a part extending a certain length in the second direction (y direction). The third portion a3 may include a part extending with a certain length in the second direction (y direction) and a plurality of parts each extending with a certain length in the third direction (z direction). In an implementation, a proportion of the parts extending with the certain length in the third direction (z direction) may be greater than a proportion of the part extending with the certain length in the second direction (y direction).

Figure 5:
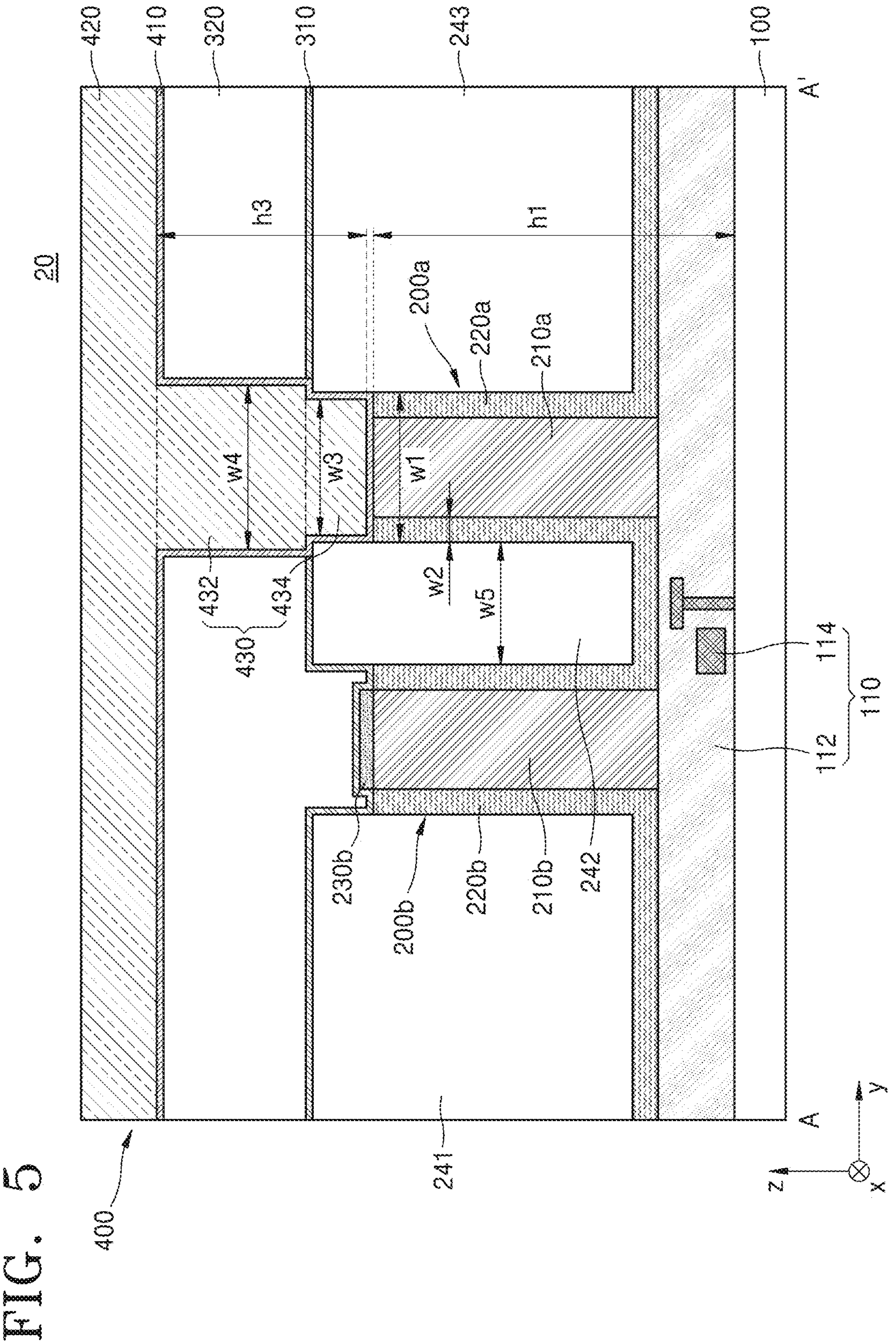
FIG. 5 is a cross-sectional view illustrating an integrated circuit device according to another embodiment.

FIG. 5 is a cross-sectional view illustrating an integrated circuit device 20 according to another embodiment.

The integrated circuit device 20 illustrated in FIG. 5 may be identical to the integrated circuit device 10 illustrated in FIG. 2 except that the first wiring structure 200*a* may not include the first capping layer 230*a*. In FIG. 5, the same reference numerals as those in FIG. 2 are simply described or omitted.

Referring to FIG. 5, the integrated circuit device 20 may include the FEOL structure 110 between the substrate 100 and the plurality of wiring structures 200*a* and 200*b*. The FEOL structure 110 includes the plurality of individual devices 114 of various types and the lower insulating layer 112. The FEOL structure 110, the individual devices 114, and the lower insulating layer 112 shown in FIG. 5 may have the same functions or may include substantially the same materials as the FEOL structure 110, the individual devices 114, and the lower insulating layer 112 shown in FIG. 2, respectively.

In an implementation, the integrated circuit device 20 may include the first wiring structure 200*a* on the substrate 100 and extending in the first direction (x direction) parallel to the upper surface of the substrate 100. The first wiring structure 200*a* may include a first wiring layer 210*a* on the substrate 100 and extending in the third direction (z direction) perpendicular to the upper surface of the substrate 100 and the FEOL structure 110. The first wiring layer 210*a* shown in FIG. 5 may have the same function or may include substantially the same material as the first wiring layer 210*a* shown in FIG. 2.

The first wiring structure 200*a* may include the first insulating pattern 220*a* surrounding the sidewall of the first wiring layer 210*a* and including a first insulating material. The first insulating pattern 220*a* may simultaneously cover the sidewall of the first wiring layer 210*a* and at least a part of the upper surface of the FEOL structure 110. In an implementation, the upper surface of the first insulating pattern 220*a* may be at substantially the same vertical level as the upper surface of the first wiring layer 210*a*. The first insulating material of the first insulating pattern 220*a* may be substantially the same material as the first insulating material described with reference to FIG. 2.

The integrated circuit device 20 may include the second wiring structure 200*b* spaced apart from the first wiring structure 200*a* in the second direction (y direction). The integrated circuit device 20 may include the first, second, and third interlayer insulating layers 241, 242, and 243 between the first wiring structure 200*a* and the second wiring structure 200*b*. In an implementation, the first, second, and third interlayer insulating layers 241, 242, and 243 may contact the first insulating pattern 220*a* of the first wiring structure 200*a* and the second insulating pattern 220*b* of the second wiring structure 200*b*. Each of the first, second, and third interlayer insulating layers 241, 242, and 243 may include a second insulating material, and the second insulating material may be substantially the same material as the second insulating material described with reference to FIG. 2. The first, second, and third interlayer insulating layers 241, 242, and 243 may cover the sidewall of the first insulating pattern 220*a* between the first wiring structure 200*a* and the second wiring structure 200*b*, and may have upper surfaces higher than the respective upper surfaces of the first wiring layer 210*a* and the first insulating pattern 220*a*.

The first, second, and third interlayer insulating layers 241, 242, and 243 may be deposited on the first insulating pattern 220*a* covering at least a part of the upper surface of the FEOL structure 110 by an ALD process or a CVD process. In an implementation, as shown in FIG. 5, the first, second, and third interlayer insulating layers 241, 242, and 243 may have a constant thickness along the sidewall of the first insulating pattern 220*a* between the first wiring structure 200*a* and the second wiring structure 200*b*.

In an implementation, the second wiring structure 200*b* may include the second capping layer 230*b* on the second wiring layer 210*b*, unlike the first wiring structure 200*a*. In an implementation, the first wiring structure 200*a* may not include a first capping layer (230*a* in FIG. 2). The second capping layer 230*b* may be on the second wiring layer 210*b* to cover at least a part of the upper surface of the second wiring layer 210*b*. The second capping layer 230*b* shown in FIG. 5 may include a third insulating material, unlike the first and second capping layers 230*a* and 230*b* including the insulating material shown in FIG. 2. In an implementation, the third insulating material may include, e.g., SiOC, SiCN, SiOCN, $Al_2O_3$, AlN, or a combination thereof. In an implementation, the third insulating material may include a low-k material having a dielectric constant equal to or less than 4.2. The third insulating material may include a material having an etch selectivity with the first insulating materials of the first and second insulating patterns 220*a* and 220*b* or the second insulating materials of the first, second, and third interlayer insulating layers 241, 242 and 243. The second capping layer 230*b* may include a material having an etch selectivity with respect to the first and second insulating patterns 220*a* and 220*b* and the first, second, and third interlayer insulating layers 241, 242 and 243, and thus, the first and second insulating patterns 220*a* and 220*b* and the first, second, and third interlayer insulating layers 241, 242 and 243 may be etched relatively slowly or hardly etched in the process of etching the second capping layer 230*b*.

The second capping layer 230*b* including the third insulating material may be on the second wiring layer 210*b* so that the second wiring layer 210*b* including the conductive material is not electrically connected to the upper wiring structure 400. In an implementation, the first wiring structure 200*a* that is to be electrically connected to the via layer 430 of the upper wiring structure 400 on the first wiring structure 200*a* may not include the second capping layer 230*b*. In an implementation, a capping layer may be formed on the first wiring layer 210*a* in the process of forming the first wiring structure 200*a*, but the capping layer on the first wiring layer 210*a* may be removed before forming the via layer 430. In an implementation, the third insulating material of the second capping layer 230*b* may include a material having an etching selectivity with the first insulating material of the first insulating pattern 220*a* and the second insulating materials of the first, second, and third interlayer insulating layers 241, 242, and 243. In an implementation, in the process of etching the capping layer, the first insulating pattern 220*a* and the first, second, and third interlayer insulating layers 241, 242, and 243 may be etched relatively slowly or hardly etched.

In an implementation, the integrated circuit device 20 may include the upper wiring structure 400 on the first wiring structure 200*a*. The upper wiring structure 400 may include the upper wiring layer 420 having a certain width and extending in the second direction (y direction), and the via layer 430 integrally formed with the upper wiring layer 420 and connected to the first wiring structure 200*a*. The upper wiring layer 420 and the via layer 430 shown in FIG. 5 may substantially have the same functions or may include substantially the same materials as the upper wiring layer 420 and the via layer 430 shown in FIG. 2.

In an implementation, the upper wiring structure 400 may include the barrier layer 410 covering side and lower surfaces of the via layer 430, and the barrier layer 410 may cover the upper surface of the first wiring layer 210*a* and the upper surface of the first insulating pattern 220*a*. The barrier layer 410 shown in FIG. 5 may substantially have the same function or may include substantially the same material as the barrier layer 410 shown in FIG. 2.

Figure 6:
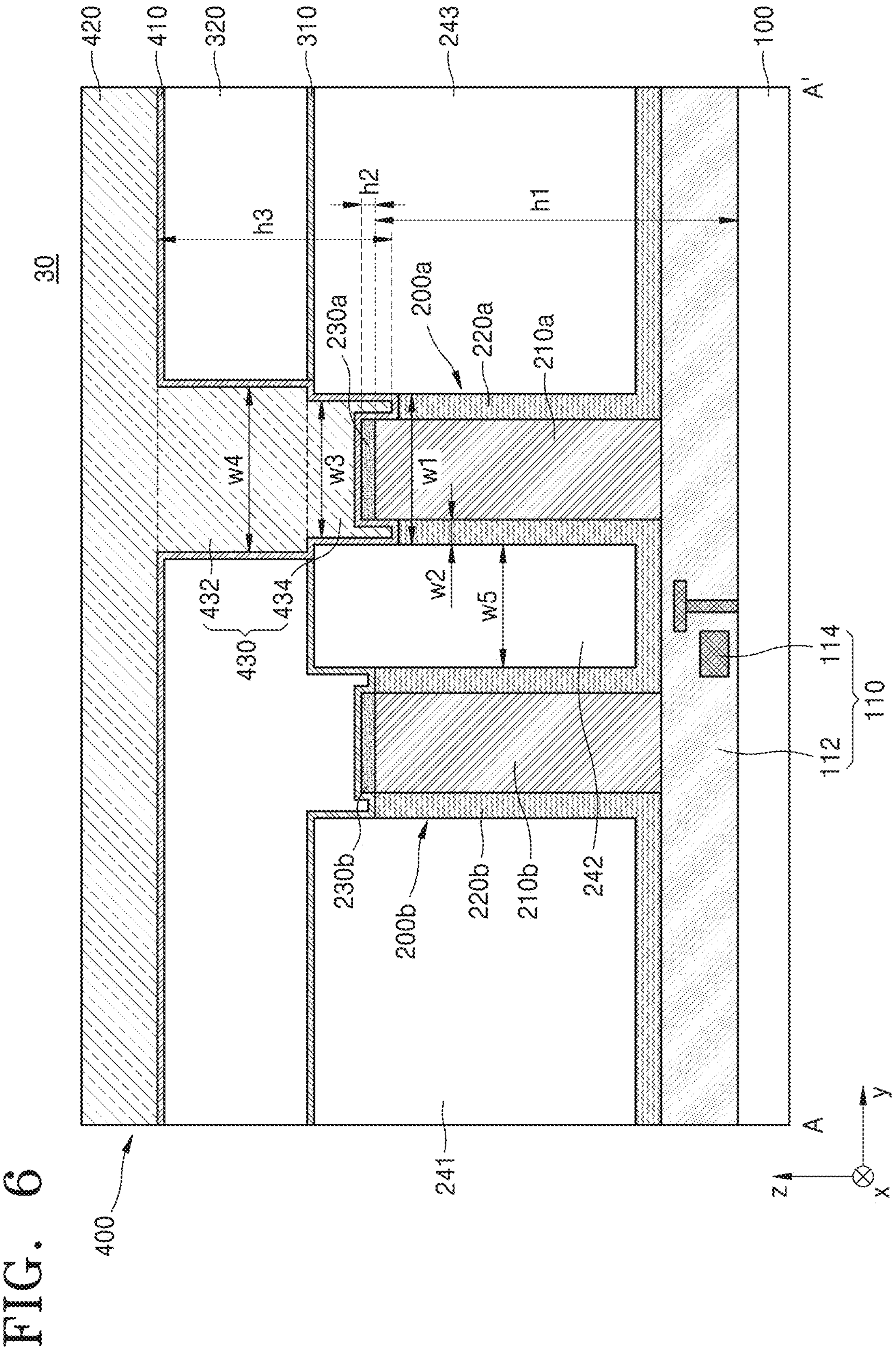
FIG. 6 is a cross-sectional view illustrating an integrated circuit device according to another embodiment.

FIG. 6 is a cross-sectional view illustrating an integrated circuit device 30 according to another embodiment.

The integrated circuit device 30 illustrated in FIG. 6 may be identical to the integrated circuit device 10 illustrated in FIG. 2 except the upper surface of the first insulating pattern 220*a* may be at a lower vertical level than the upper surface of the first wiring layer 210*a*. In FIG. 6, the same reference numerals as those in FIG. 2 are simply described or omitted.

Hereinafter, for convenience of description, FIG. 6 is described with reference to FIGS. 8D and 8E together. Referring to FIG. 6, the upper surface of the first insulating pattern 220*a* included in the first wiring structure 200*a* may be positioned at a lower vertical level than the upper surface of the first wiring layer 210*a*. In an implementation, the first insulating pattern 220*a* may be formed by etching an insulating layer (220 in FIG. 8D) in the process of forming the first wiring structure 200*a*. When a process time taken to etch the insulating layer (220 in FIG. 8D) is long, the insulating layer (220 in FIG. 8D) may be etched until the upper surface of the insulating layer (220 in FIG. 8D) is positioned at a vertical level lower than the upper surface of the first wiring structure 200*a*.

In an implementation, the insulating layer (220 of FIG. 8D) may include a first insulating material. In an implementation, the first insulating material may include a material having an etch selectivity with respect to second insulating materials included in the first, second, and third interlayer insulating layers 241, 242, and 243 and a fourth insulating material included in an upper capping layer (250 in FIG. 8D). In an implementation, the first, second, and third interlayer insulating layers 241, 242, and 243 and the first capping layer 230*a* may be etched relatively slowly or hardly etched in the process of etching the insulating layer (220 of FIG. 8D).

Figure 7:
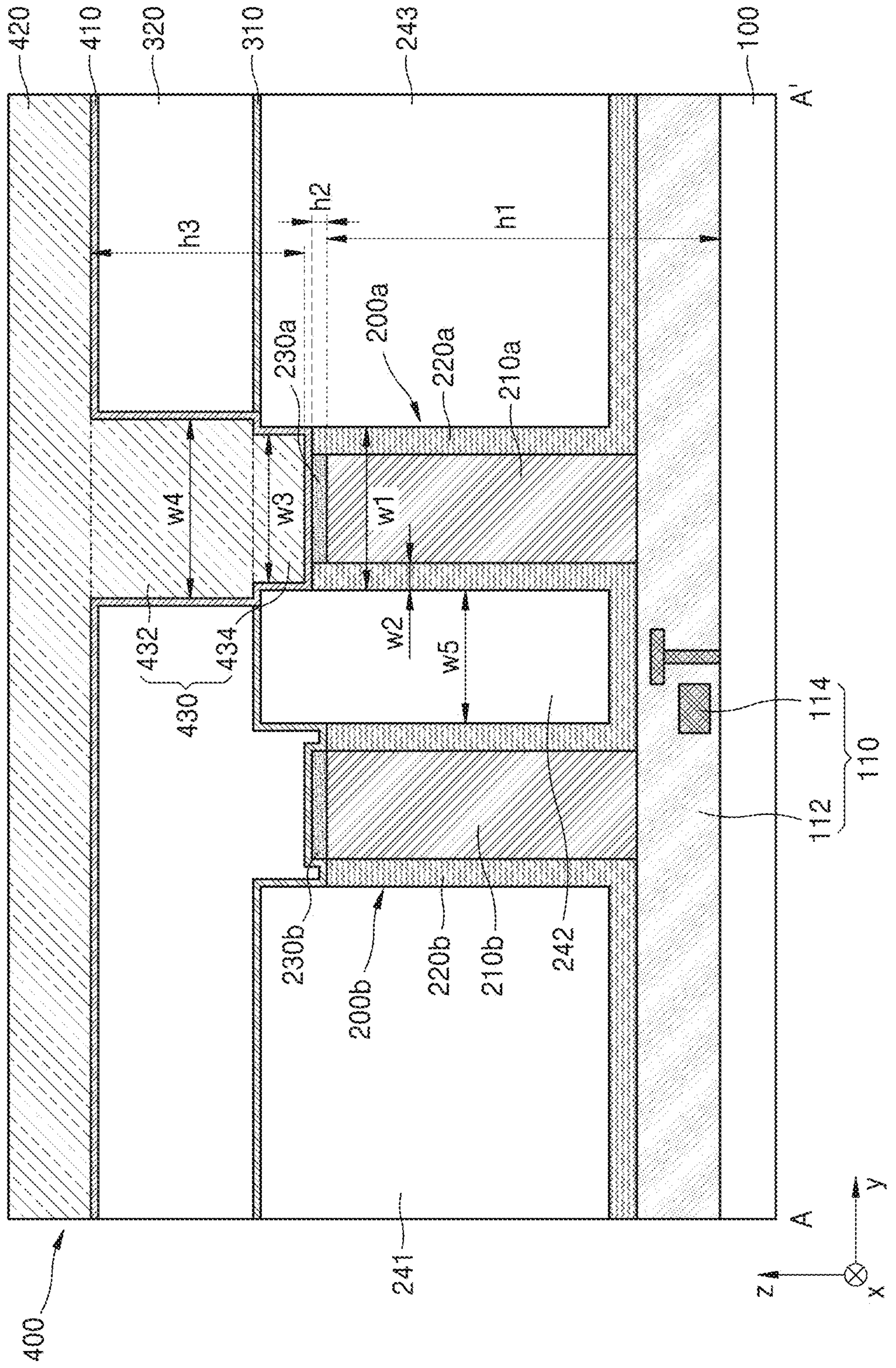
FIG. 7 is a cross-sectional view illustrating an integrated circuit device according to another embodiment.

FIG. 7 is a cross-sectional view illustrating an integrated circuit device 40 according to another embodiment.

The integrated circuit device 40 illustrated in FIG. 7 may be identical to the integrated circuit device 10 illustrated in FIG. 2 except the upper surface of the first insulating pattern 220*a* may be at a higher vertical level than the upper surface of the first wiring layer 210*a*. In FIG. 7, the same reference numerals as those in FIG. 2 are simply described or omitted.

Hereinafter, for convenience of description, FIG. 7 is described with reference to FIGS. 8D and 8E together. Referring to FIG. 7, the upper surface of the first insulating pattern 220*a* included in the first wiring structure 200*a* may be at a higher vertical level than the upper surface of the first wiring layer 210*a*. In an implementation, the first insulating pattern 220*a* may be formed by etching the insulating layer (220 in FIG. 8D) in the process of forming the first wiring structure 200*a*. When a process time taken to etch the insulating layer (220 in FIG. 8D) is short and the upper surface of the insulating layer (220 in FIG. 8D) is positioned at a higher vertical level than the upper surface of the first wiring structure 200*a*, etching of the insulating layer (220 in FIG. 8D) may be stopped.

In an implementation, the insulating layer (220 of FIG. 8D) may include a first insulating material. In an implementation, the first insulating material may include a material having an etch selectivity with respect to second insulating materials included in the first, second, and third interlayer insulating layers 241, 242, and 243 and a fourth insulating material included in the upper capping layer (250 in FIG. 8D). In an implementation, the first, second, and third interlayer insulating layers 241, 242, and 243 and the first capping layer 230*a* may be etched relatively slowly or hardly etched in the process of etching the insulating layer (220 of FIG. 8D).

FIGS. 8A to 8I are cross-sectional views of stages in a method of manufacturing an integrated circuit device according to an embodiment.

Figure 8A:
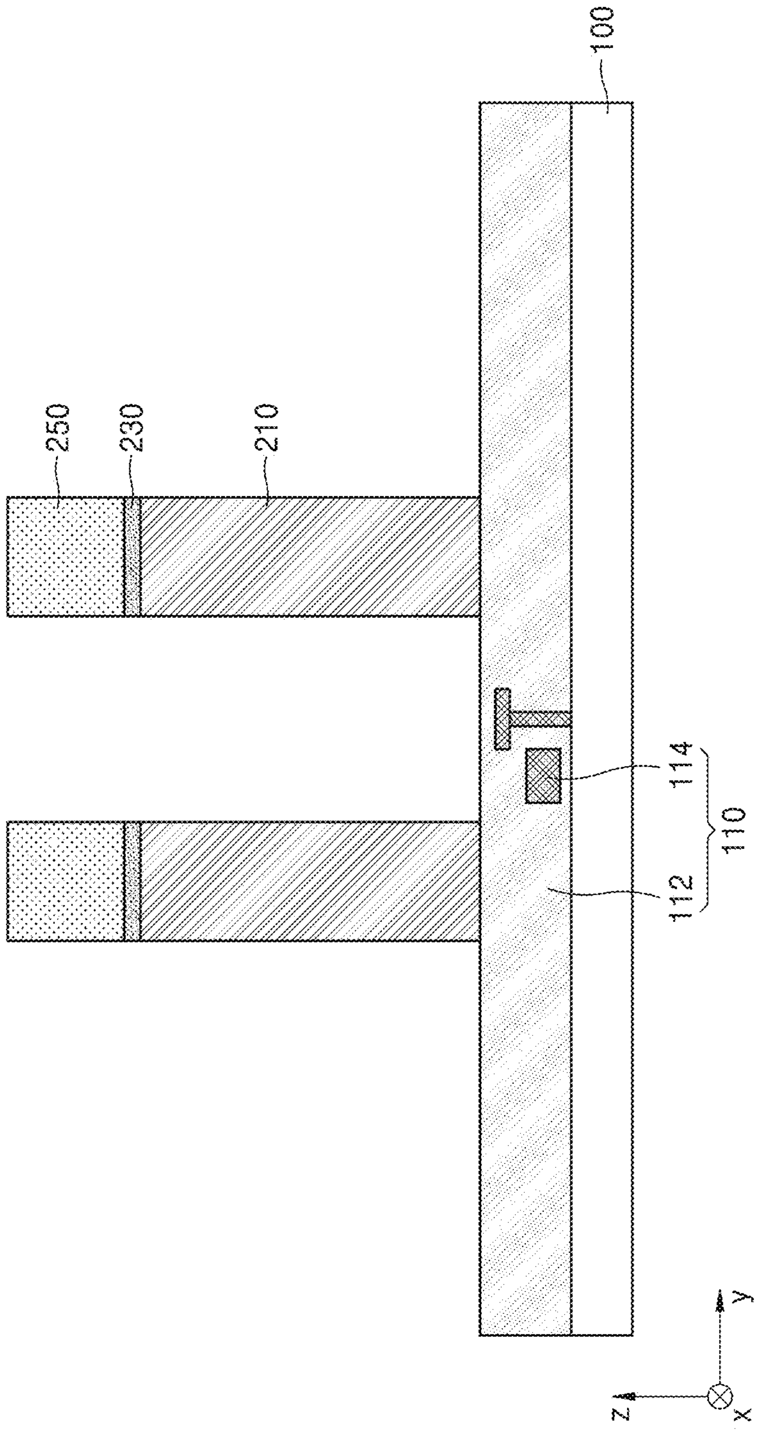
FIGS. 8A to 8I are cross-sectional views of stages in a method of manufacturing an integrated circuit device according to an embodiment.

Referring to FIG. 8A, the FEOL structure 110 may be provided on the substrate 100. The FEOL structure 110 may include the plurality of individual devices 114 of various types and the lower insulating layer 112. The FEOL structure 110 shown in FIG. 8A is substantially the same as the FEOL structure described with reference to FIG. 2, and thus, a repeated detailed description thereof may be omitted.

A wiring layer 210 extending in the direction (z direction) perpendicular to the upper surface of the substrate 100, a capping layer 230 covering at least a part of the upper surface of the wiring layer 210, and an upper capping layer 250 covering at least a part of the upper surface of the capping layer 230 may be formed on the FEOL structure 110. The upper capping layer 250 may include a fourth insulating material covering at least a part of the capping layer 230. The fourth insulating material may include a silicon nitride, e.g., SiN, SiON, or a combination thereof. In an implementation, the fourth insulating material may include a material having an etch selectivity with the first insulating material of the insulating pattern (220 in FIG. 8B) and the second insulating materials of the first, second, and third interlayer insulating layers (241, 242 and 243 in FIG. 8D). In an implementation, as illustrated in FIG. 8A, the height of the upper capping layer 250 may be higher than that of the capping layer 230 and shorter than that of the wiring layer 210 in the direction (z direction) perpendicular to the upper surface of the substrate 100.

Figure 8B:
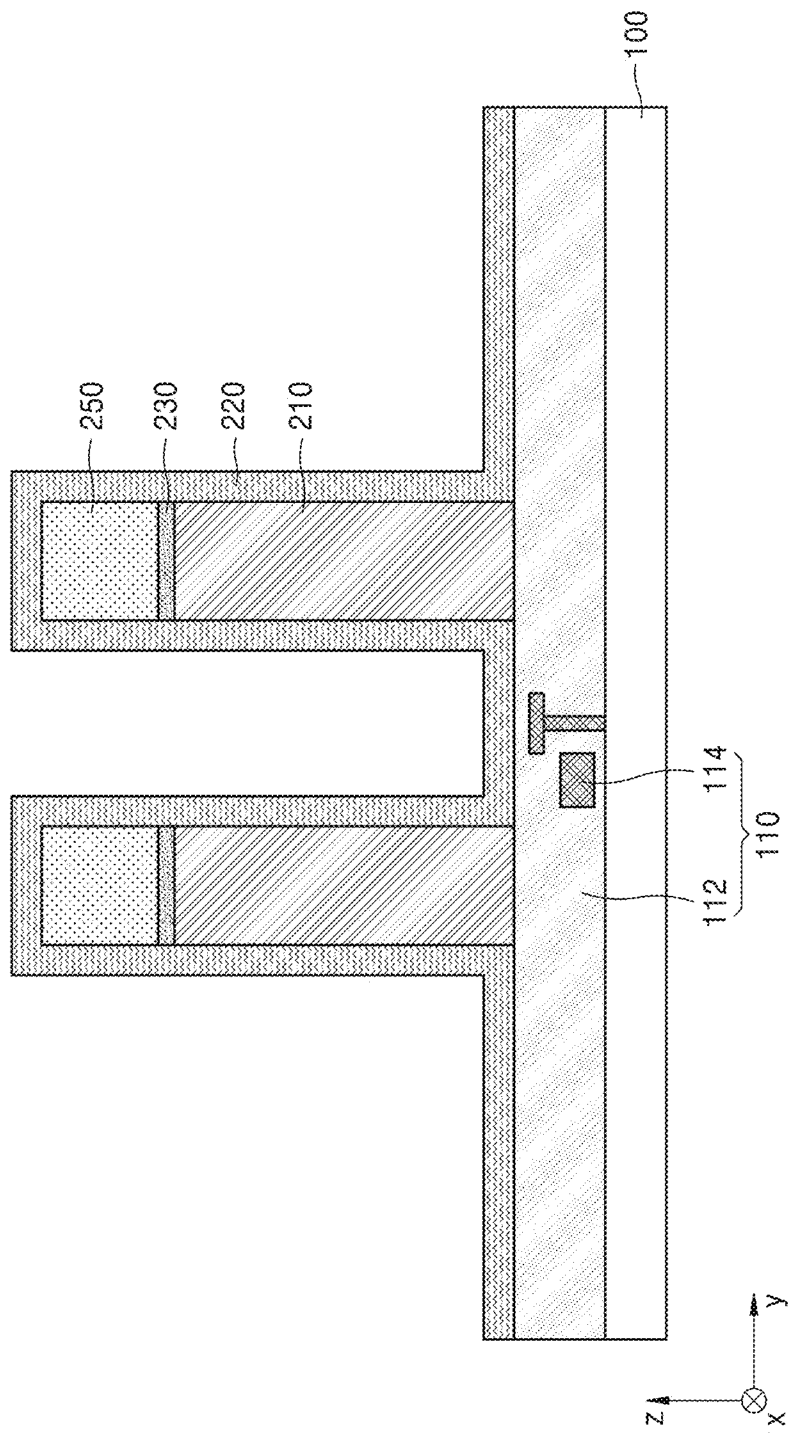
Figure 8C:
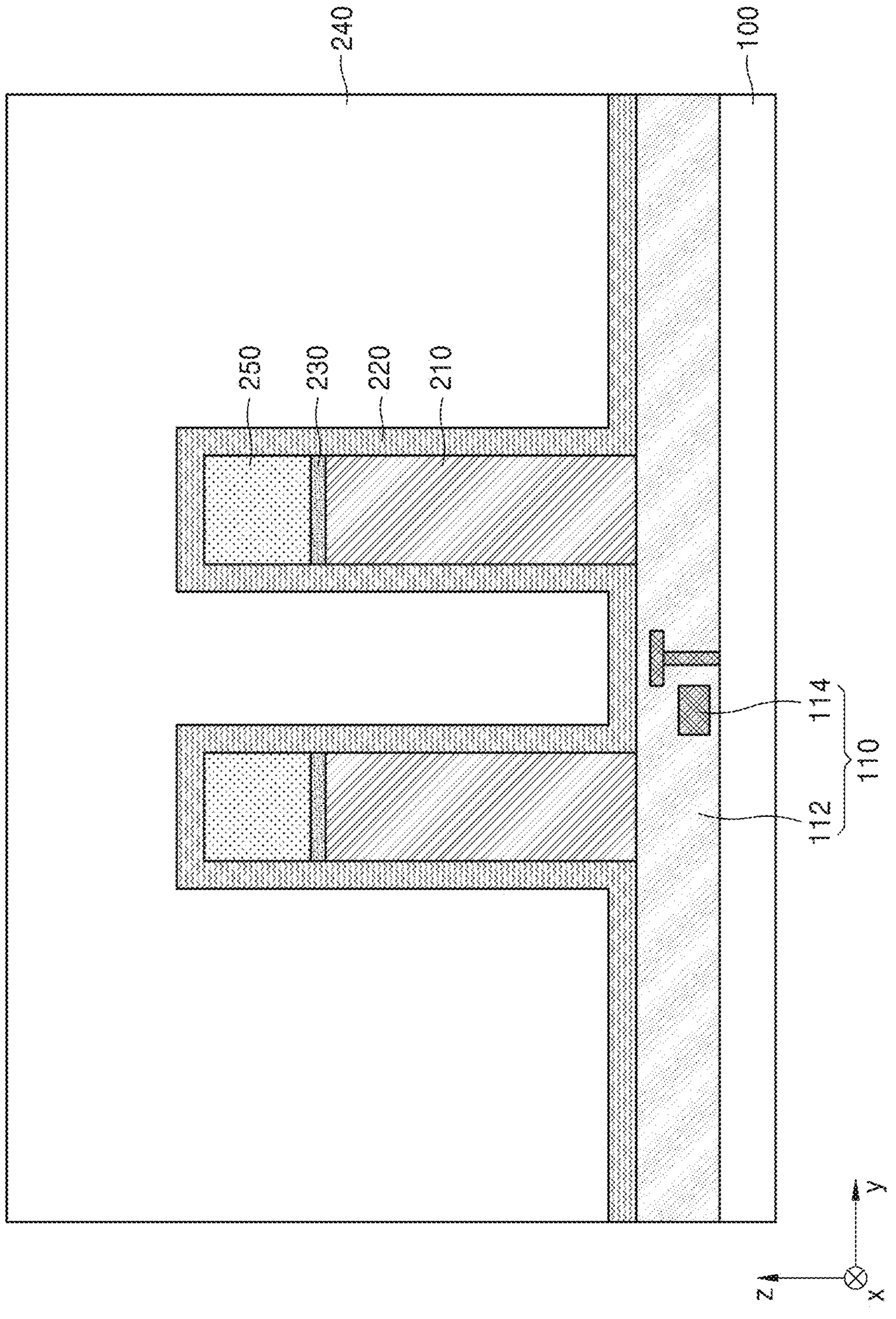

Referring to FIGS. 8B and 8C, the insulating layer 220 covering at least a part of the upper surface of the FEOL structure 110 may be formed. In an implementation, the insulating layer 220 may cover the sidewalls of the wiring layer 210 and the first capping layer 230*a*, and the sidewall and upper surface of the upper capping layer 250. After the insulating layer 220 is formed, the interlayer insulating layer 240 covering the upper surface of the insulating layer 220 may be formed. In an implementation, the insulating layer 220 and the interlayer insulating layer 240 may be deposited by an ALD process or a CVD process. In an implementation, the insulating layer 220 may have a uniform width and be formed on at least a part of the upper surface of the FEOL structure 110. In an implementation, a certain angle may be formed at a corner portion where the FEOL structure 110 contacts the wiring layer 210, and the insulating layer 220 may be formed with a uniform width even in such a portion. The wiring layer 210 may extend in the direction (z direction) perpendicular to the upper surface of the substrate 100, and thus, a certain angle may be formed between a portion of the insulating layer 220 covering the sidewall of the wiring layer 210 and a portion of the insulating layer 220 covering the upper surface the FEOL structure 110. The interlayer insulating layer 240 may be uniformly deposited even in such a portion. The thickness of the wiring structure to be completed thereafter may be adjusted by adjusting the thickness of the insulating layer 220 in the process of depositing the insulating layer 220.

Figure 8D:
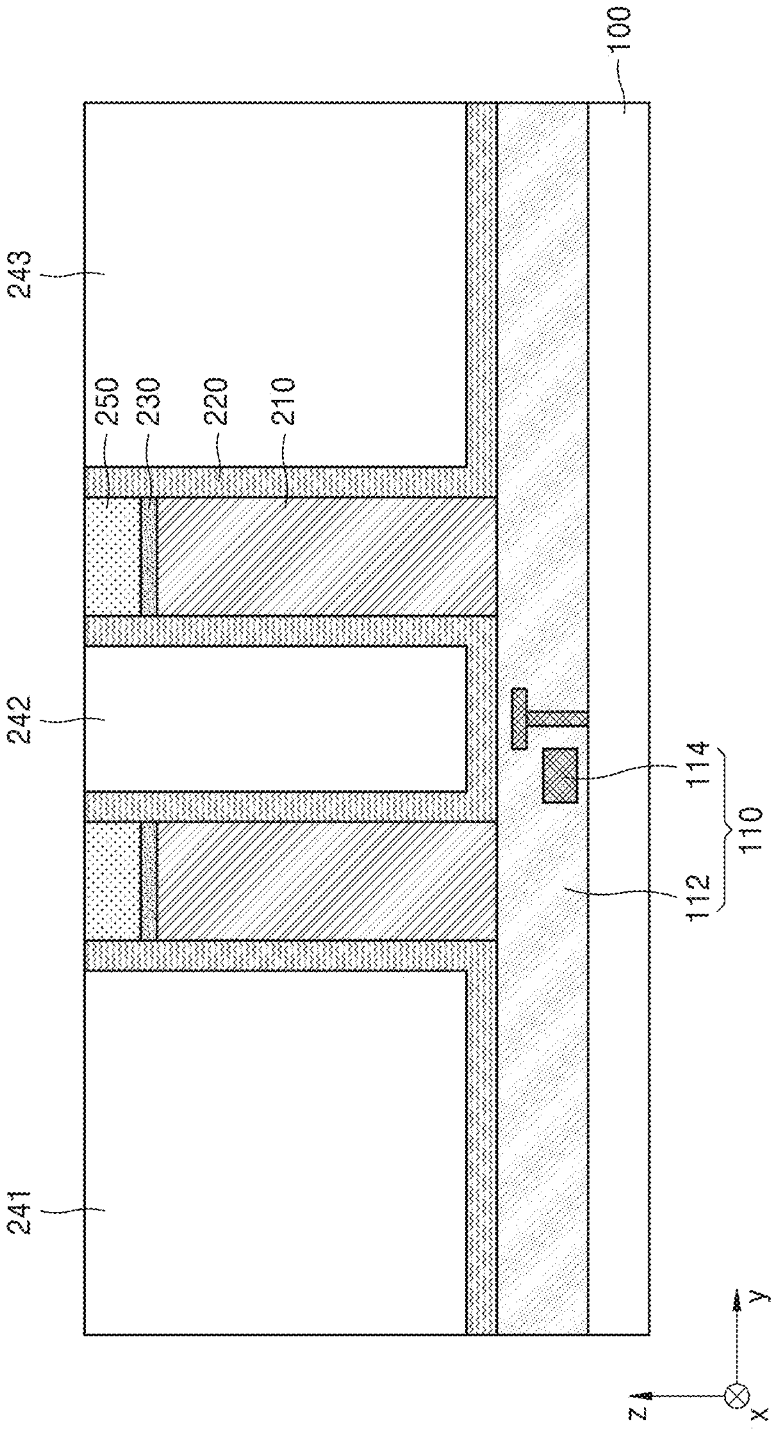

Referring to FIG. 8D, a part of the insulating layer 220, a part of the upper capping layer 250, and a part of the interlayer insulating layer 240 may be removed by a chemical mechanical polishing (CMP) process. As the part of the interlayer insulating layer 240 is removed by the CMP process, the third interlayer insulating layer 243 on the right side of the wiring layer 210 in the second direction (y direction), the second interlayer insulating layer 242 on the left side of the wiring layer 210, and the first interlayer insulating layer 241 spaced apart from the second interlayer insulating layer 242 and on the left side of the second interlayer insulating layer 242 may be formed.

Figure 8E:
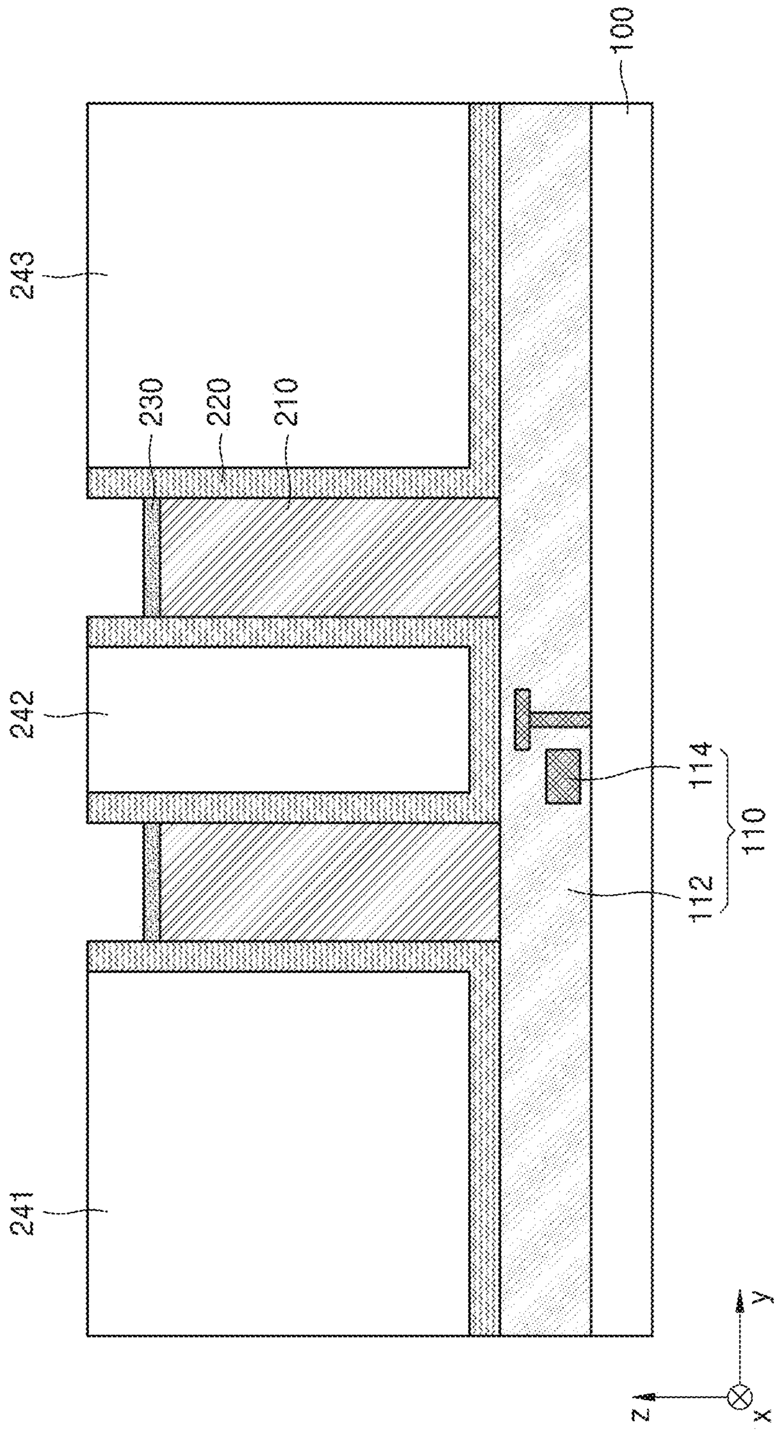
Figure 8F:
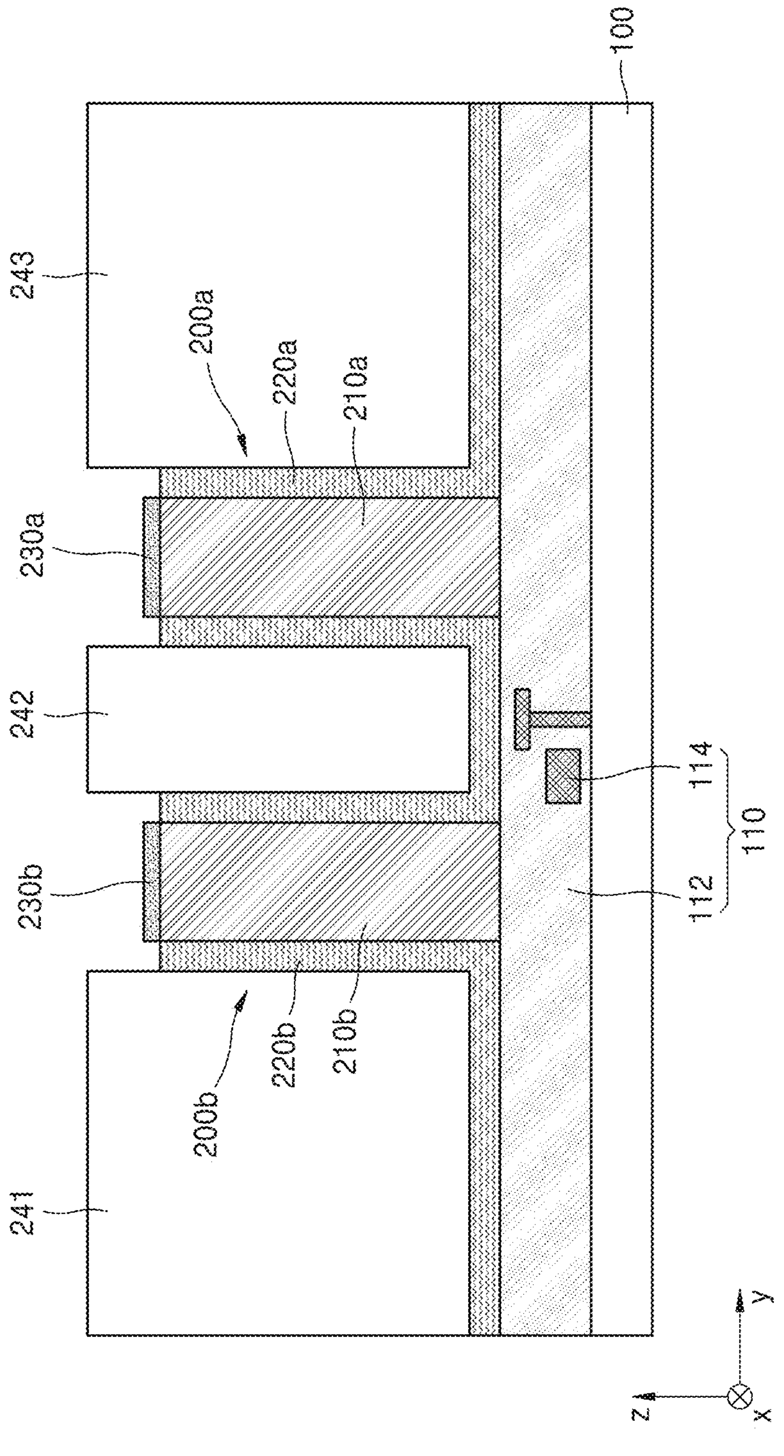

Referring to FIGS. 8E and 8F, at least a part of the upper capping layer 250 may be etched. In an implementation, the height of a wiring structure to be completed thereafter may be adjusted by adjusting a degree of etching the upper capping layer 250. The process of etching the upper capping layer 250 may be a process using an etching selectivity, and thus, in the process of etching the upper capping layer 250, the first, second, and third interlayer insulating layers 241, 242, and 243 and the insulating layer 220 may be etched relatively slowly or hardly etched. Thereafter, at least a part of the insulating layer 220 may be etched. In an implementation, the height of the first insulating pattern 220*a* covering the side surface of the first wiring layer 210*a* may be adjusted by adjusting a degree of etching the insulating layer 220. The process of etching the insulating layer 220 may be a process using an etching selectivity, and thus, in the process of etching the insulating layer 220, the first, second, and third interlayer insulating layers 241, 242, and 243 and the first and second capping layers 230*a* and 230*b* may be etched relatively slowly or hardly etched.

Figure 8G:
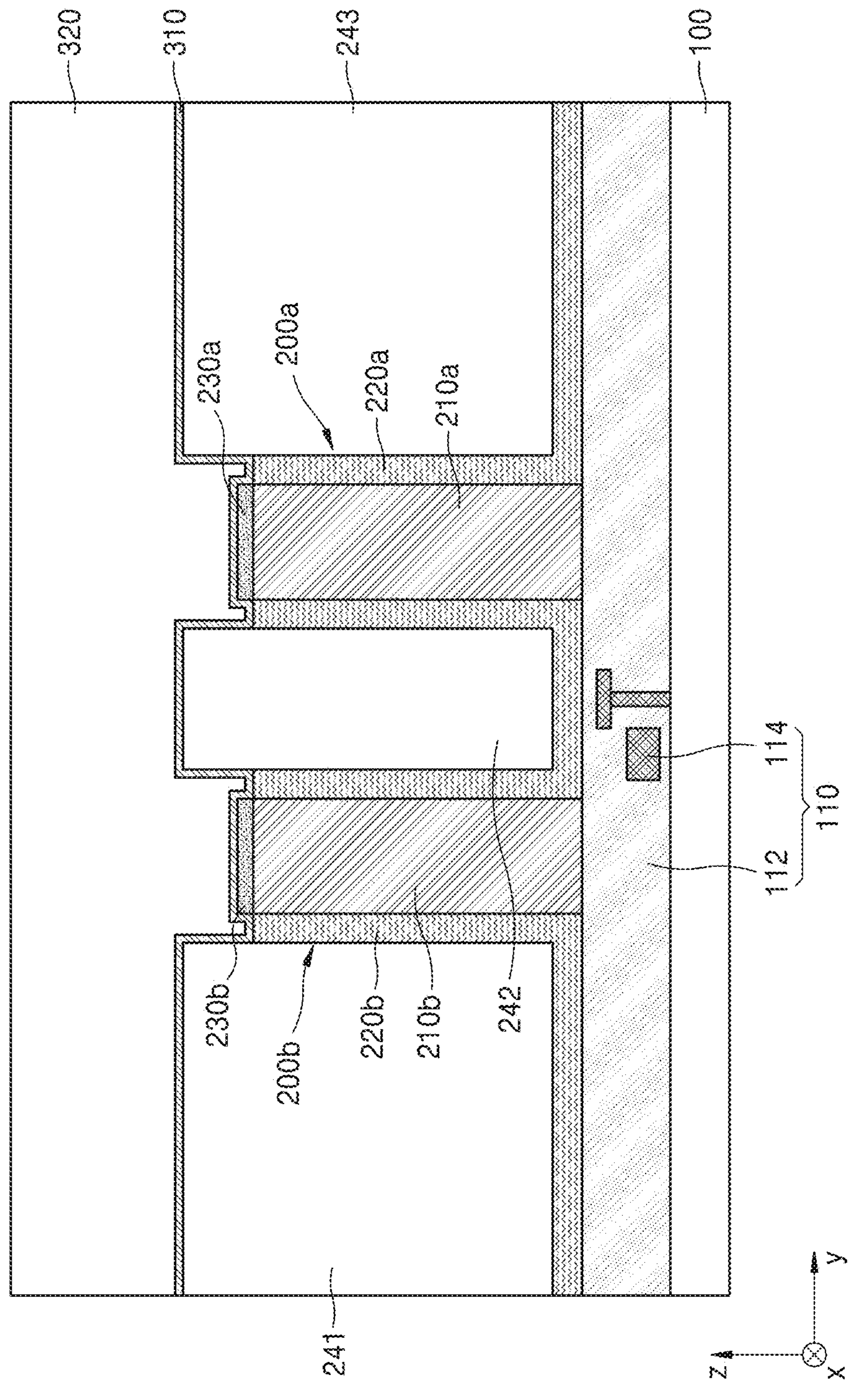
Figure 8H:
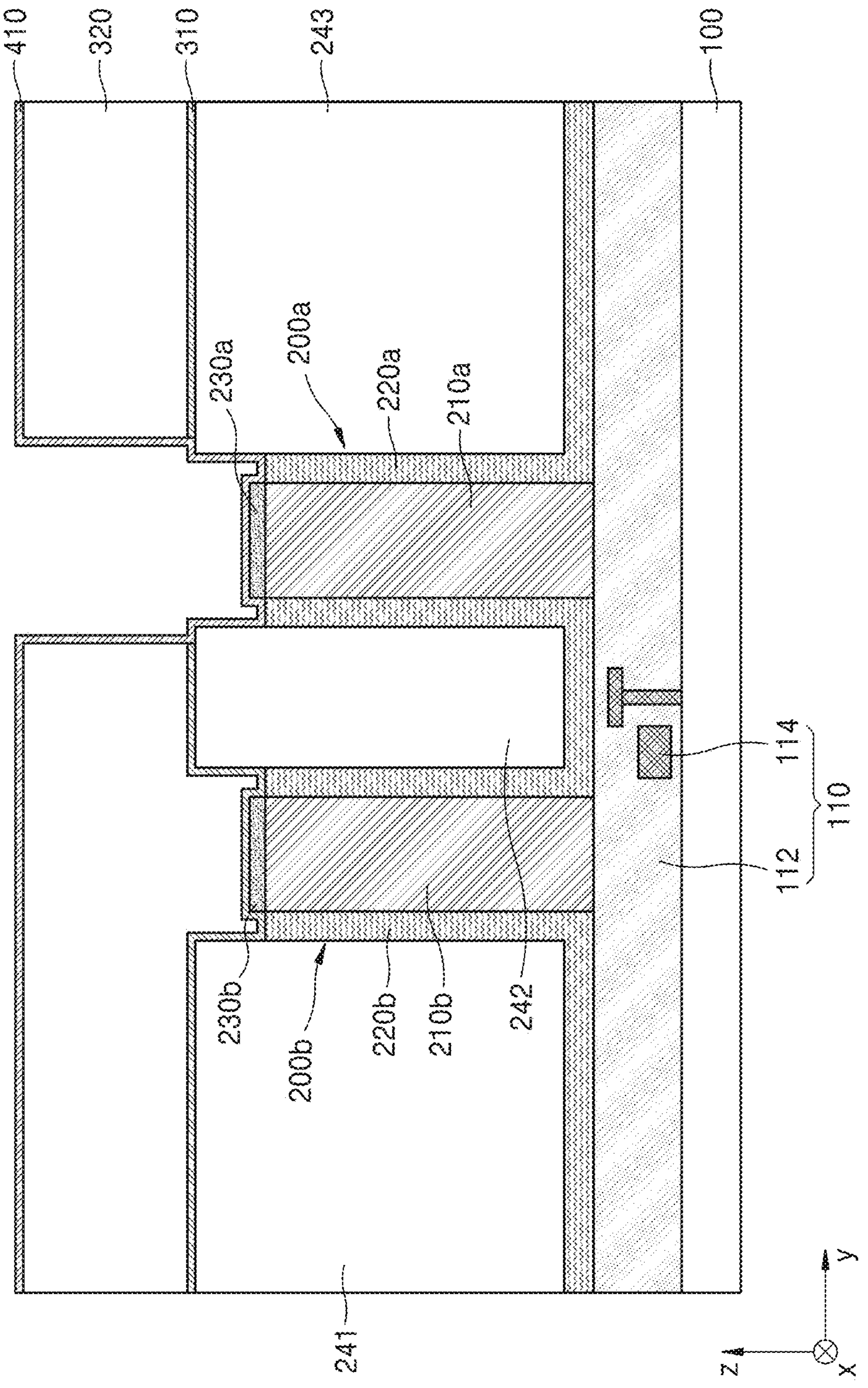
Figure 8I:
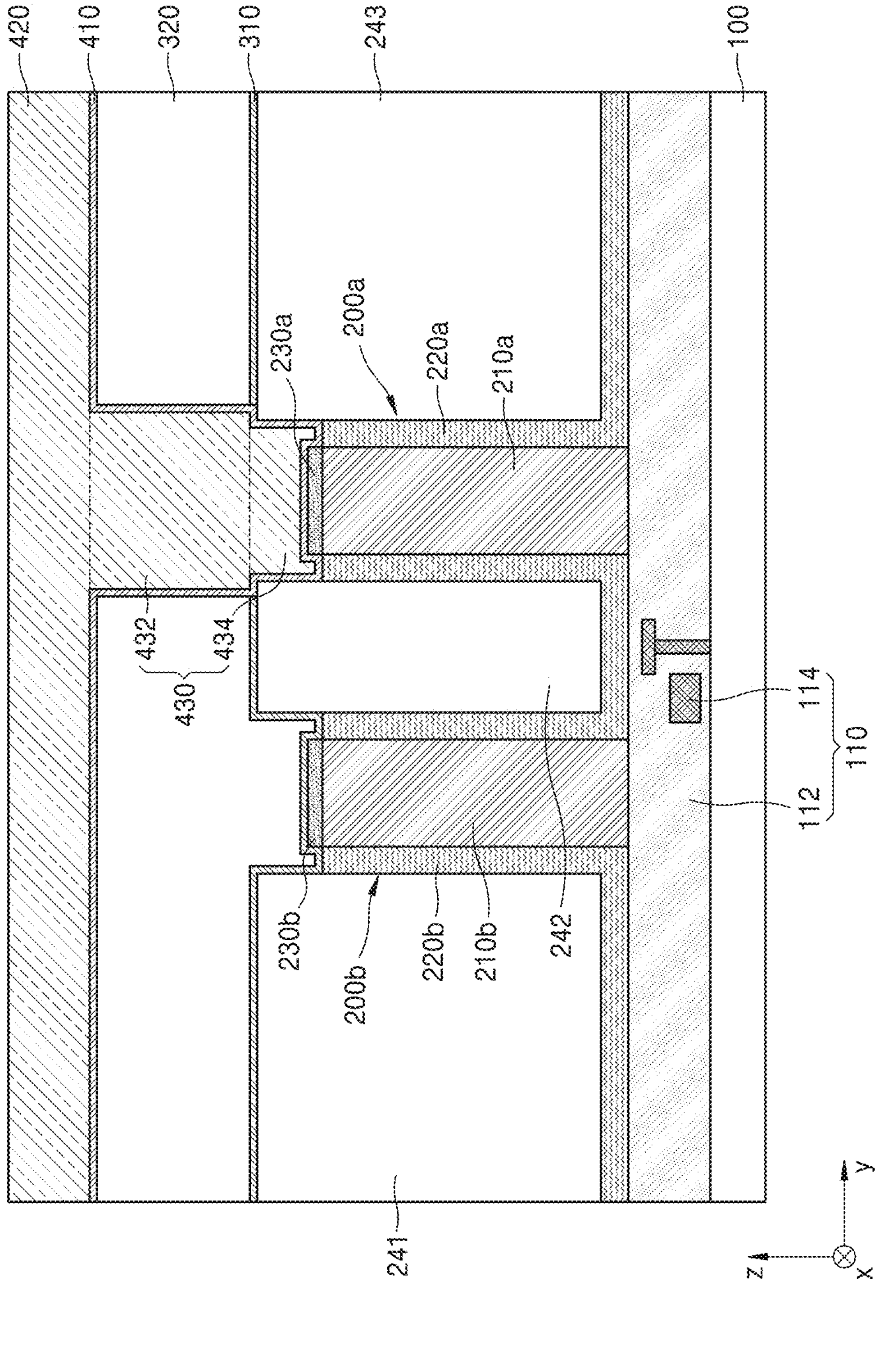

Referring to FIGS. 8G to 8I, the etch stop layer 310 may be formed to cover the upper surfaces and sidewalls of the first, second, and third interlayer insulating layers 241, 242, and 243, the upper surfaces of the first and second insulating patterns 220*a* and 220*b*, and the upper surfaces and sidewalls of the first and second capping layers 230*a* and 230*b*. After the etch stop layer 310 is formed, the upper insulating layer 320 may be formed on the etch stop layer 310. Thereafter, parts of the upper insulating layer 320 and the etch stop layer 310 corresponding to the first wiring structure 200*a* may be etched, and then, the barrier layer 410 may be formed to cover the sidewall and upper surface of the upper insulating layer 320, the upper surface of the first insulating pattern 220*a*, and the sidewall and upper surface of the first capping layer 230*a*. After forming the barrier layer 410, the upper wiring layer 420 may be formed on the barrier layer 410. At this time, the via layer 430 may be formed in a gap on the first wiring structure 200*a*. The upper wiring layer 420 and the via layer 430 may be deposited by the ALD process or the CVD process.

By way of summation and review, in order to reduce the RC delay, copper, which has a lower specific resistance than aluminum and has better resistance to electro migration (EM) and stress induced migration (SM) characteristics than aluminum, may be used as a metal wiring material. Copper may not be easy to etch. A damascene process may be used to form copper wiring.

One or more embodiments may provide an integrated circuit device capable of preventing damage to a wiring layer in an etching process by forming a capping layer on the wiring layer and easily adjusting vertical and horizontal levels of a wiring structure.

One or more embodiments may provide an integrated circuit device including an interlayer wiring connection structure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An integrated circuit device, comprising:
- a front-end-of-line (FEOL) structure including a substrate, a plurality of integrated devices, and a lower insulating layer on the substrate;
- a plurality of wiring structures on the FEOL structure, the plurality of wiring structures extending in a first direction parallel to an upper surface of the substrate and each including:
  - a wiring layer on an upper surface of the lower insulating layer and extending in a vertical direction, perpendicular to the upper surface of the substrate, from the upper surface of the lower insulating layer to an upper surface of the wiring layer;

an insulating pattern surrounding a sidewall of the wiring layer and including a first insulating material, the insulating pattern including a portion extending continuously in the vertical direction from the upper surface of the lower insulating layer to an upper surface of the insulating pattern; and a capping layer on the upper surface of the wiring layer and including a conductive material;

a via layer on and connected to a first wiring structure of the plurality of wiring structures; and an interlayer insulating layer covering a sidewall of the insulating pattern between each wiring structure of the plurality of wiring structures, the interlayer insulating layer having an upper surface higher than the upper surface of each wiring layer and the upper surface of each insulating pattern, wherein the portion of each insulating pattern has a constant width in a second direction perpendicular to the first direction and perpendicular to the vertical direction, and wherein each wiring layer has a constant width in the second direction.

2. The integrated circuit device as claimed in claim 1, wherein:

a height of each capping layer in the vertical direction is less than a height of each wiring layer, and the height of each capping layer in the vertical direction is less than a height of the via layer.

3. The integrated circuit device as claimed in claim 1, wherein:

the interlayer insulating layer includes a second insulating material, and the second insulating material includes a material different from the first insulating material.

4. The integrated circuit device as claimed in claim 1, wherein for each of the plurality of wiring structures the upper surface of the insulating pattern is at a vertical level that is lower than an upper surface of the capping layer.

5. The integrated circuit device as claimed in claim 1, wherein the via layer includes:

a first portion having a width in the second direction that is less than a width of the first wiring structure in the second direction; and a second portion on the first portion, the second portion having a width in the second direction that is greater than the width of the first wiring structure in the second direction.

6. The integrated circuit device as claimed in claim 1, further comprising a barrier layer surrounding side surfaces and lower surfaces of the via layer, wherein the barrier layer is in contact with upper surfaces and side surfaces of the capping layer of the first wiring structure.

7. The integrated circuit device as claimed in claim 6, wherein the barrier layer includes:

a first portion covering a part of the upper surface of the interlayer insulating layer;

a second portion covering the upper surface of the capping layer of the first wiring structure at a vertical level lower than the upper surface of the interlayer insulating layer; and a third portion covering the upper surface of the insulating pattern of the first wiring structure and protruding toward the substrate.

8. The integrated circuit device as claimed in claim 1, wherein the first insulating material includes $SiO_2$, $Al_2O_3$, or a combination thereof.

9. The integrated circuit device as claimed in claim 1, wherein the conductive material includes graphene, Ti, Al, Cr, Au, Ni, Pt, or a combination thereof.

10. The integrated circuit device as claimed in claim 1, wherein each insulating pattern has a constant thickness along the sidewall of each wiring layer.

11. An integrated circuit device, comprising:

a front-end-of-line (FEOL) structure including a substrate, a plurality of integrated devices, and a lower insulating layer on the substrate;

a first wiring structure on the FEOL structure, the first wiring structure extending in a first direction parallel to an upper surface of the substrate;

a second wiring structure spaced apart from the first wiring structure in a second direction perpendicular to the first direction;

a via layer on the first wiring structure and connected to the first wiring structure; and an interlayer insulating layer between the first wiring structure and the second wiring structure, wherein:

the first wiring structure includes:

a first wiring layer directly on an upper surface of the FEOL structure and extending continuously in a vertical direction, perpendicular to the upper surface of the substrate, from an upper surface of the FEOL structure to an upper surface of the first wiring layer, and an insulating pattern surrounding a sidewall of the first wiring layer and including a first insulating material, the insulating pattern including a portion extending continuously in the vertical direction from the upper surface of the FEOL structure to an upper surface of the insulating pattern, and the interlayer insulating layer covers a sidewall of the insulating pattern between the first wiring structure and the second wiring structure and has an upper surface higher than the upper surface of the first wiring layer and the upper surface of the insulating pattern, the portion of the insulating pattern of the first wiring structure has a constant width in the second direction perpendicular to the first direction and perpendicular to the vertical direction.

12. The integrated circuit device as claimed in claim 11, wherein the interlayer insulating layer is in contact with the sidewall of the insulating pattern.

13. The integrated circuit device as claimed in claim 11, wherein:

the interlayer insulating layer includes a second insulating material, and the second insulating material includes $SiO_2$, SiCOH, SiF, SiOC, or a combination thereof.

14. The integrated circuit device as claimed in claim 11, wherein the second wiring structure includes:

a second wiring layer on the substrate and extending in the vertical direction; and a capping layer on the upper surface of the second wiring layer and including a third insulating material.

15. The integrated circuit device as claimed in claim 14, wherein the third insulating material includes SiOC, SiCN, SiOCN, $Al_2O_3$, AlN, or a combination thereof.

16. The integrated circuit device as claimed in claim 11, wherein the interlayer insulating layer has a constant width between the first wiring structure and the second wiring structure in the second direction.

17. The integrated circuit device as claimed in claim 11, wherein the upper surface of the insulating pattern is at substantially a same vertical level as the upper surface of the first wiring layer.

18. The integrated circuit device as claimed in claim 11, further comprising: a barrier layer covering side surfaces and lower surfaces of the via layer, wherein the barrier layer covers the upper surface of the first wiring layer and the upper surface of the insulating pattern.

19. An integrated circuit device, comprising:

a front-end-of-line (FEOL) structure including a substrate, a plurality of integrated devices, and a lower insulating layer on the substrate;

a plurality of wiring structures on the FEOL structure, the plurality of wiring structures extending in a first direction parallel to an upper surface of the substrate and each including:

a wiring layer directly on an upper surface of the FEOL structure and extending continuously in a vertical direction, perpendicular to the upper surface of the substrate, from the upper surface of the FEOL structure to an upper surface of the wiring layer, an insulating pattern surrounding a sidewall of the wiring layer and including a first insulating material, the insulating pattern including a portion extending continuously in the vertical direction from the upper surface of the FEOL structure to an upper surface of the insulating pattern, and a capping layer on the upper surface of the wiring layer and including a conductive material, a via layer on and connected to a first wiring structure of the plurality of wiring structures; and an interlayer insulating layer covering a sidewall of the insulating pattern between each wiring structure of the plurality of wiring structures, the interlayer insulating layer having an upper surface higher than the upper surface of each wiring layer and higher than the upper surface of each insulating pattern, wherein:

each capping layer has a height in the vertical direction that is less than a height of each wiring layer and is less than a height of the via layer, the upper surface of each insulating pattern is at a vertical level lower than an upper surface of each capping layer, each insulating pattern has a constant thickness along the sidewall of each wiring layer, the via layer includes:

a first portion having a width in a second direction perpendicular to the first direction and perpendicular to the vertical direction that is less than a width of the first wiring structure, and a second portion on the first portion, the second portion having a width in the second direction that is greater than the width of the first wiring structure in the second direction, the first insulating material includes $SiO_2$, $Al_2O_3$, or a combination thereof, and the conductive material includes graphene, Ti, Al, Cr, Au, Ni, Pt, or a combination thereof.

20. The integrated circuit device as claimed in claim 19, further comprising a barrier layer surrounding side surfaces and lower surfaces of the via layer, wherein:

the barrier layer is in contact with upper surfaces and side surfaces of the capping layer of the first wiring structure, and the barrier layer includes:

a first portion covering a part of the upper surface of the interlayer insulating layer;

a second portion covering the upper surface of the capping layer of the first wiring structure at a vertical level lower than the upper surface of the interlayer insulating layer; and a third portion covering an upper surface of the insulating pattern of the first wiring structure and protruding toward the substrate.

* * * * *